(12) United States Patent
Lee et al.

(10) Patent No.: US 9,136,375 B2
(45) Date of Patent: Sep. 15, 2015

(54) SEMICONDUCTOR STRUCTURE

(71) Applicant: UNITED MICROELECTRONICS CORP., Hsinchu (TW)

(72) Inventors: Chiu-Te Lee, Hsinchu County (TW); Ming-Shun Hsu, Miaoli County (TW); Ke-Feng Lin, Taipei (TW); Chih-Chung Wang, Hsinchu (TW); Hsuan-Po Liao, Hsinchu County (TW); Shih-Teng Huang, Taichung (TW); Shu-Wen Lin, Hsinchu County (TW); Su-Hwa Tsai, Hsinchu (TW); Shih-Yin Hsiao, Chiayi County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 160 days.

(21) Appl. No.: 14/085,939

(22) Filed: Nov. 21, 2013

(65) Prior Publication Data

US 2015/0137228 A1 May 21, 2015

(51) Int. Cl.
| | | |
|---|---|---|
| *H01L 29/78* | (2006.01) | |
| *H01L 27/088* | (2006.01) | |
| *H01L 29/06* | (2006.01) | |
| *H01L 29/10* | (2006.01) | |

(52) U.S. Cl.
CPC .......... *H01L 29/7816* (2013.01); *H01L 27/088* (2013.01); *H01L 29/0653* (2013.01); *H01L 29/1095* (2013.01)

(58) Field of Classification Search
CPC ............ H01L 29/7816; H01L 29/0653; H01L 29/1095; H01L 27/088
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |

(Continued)

*Primary Examiner* — David Vu
(74) *Attorney, Agent, or Firm* — WPAT, P.C.; Justin King

(57) ABSTRACT

A semiconductor structure is provided. The semiconductor structure comprises a substrate, a deep well formed in the substrate, a first well and a second well formed in the deep well, a gate electrode formed on the substrate and disposed between the first well and the second well, a first isolation, and a second isolation. The second well is spaced apart from the first well. The first isolation extends down from the surface of the substrate and is disposed between the gate electrode and the second well. The second isolation extends down from the surface of the substrate and is adjacent to the first well. A ratio of a depth of the first isolation to a depth of the second isolation is smaller than 1.

15 Claims, 3 Drawing Sheets

(56) References Cited

U.S. PATENT DOCUMENTS

| | | |
|---|---|---|
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0117122 A1 | 5/2010 | Benoit |
| 2010/0148250 A1 | 6/2010 | Lin |
| 2010/0213517 A1 | 8/2010 | Sonsky |
| 2011/0057263 A1 | 3/2011 | Tang |
| 2013/0277742 A1 | 10/2013 | Lee |
| 2014/0001549 A1* | 1/2014 | Bode et al. .................. 257/337 |

* cited by examiner

SEMICONDUCTOR STRUCTURE

BACKGROUND

1. Technical Field

The disclosure relates in general to a semiconductor structure, and more particularly to a semiconductor structure having a first isolation and a second isolation, wherein a ratio of a depth of the first isolation to a depth of the second isolation is smaller than 1.

2. Description of the Related Art

With the development of semiconductor technology, reduction of feature size, improvements of the rate, the efficiency, the density and the cost per semiconductor structure are the important goals in the semiconductor technology. High power devices have been applied as semiconductor elements. On-resistance (Ron) is one of key factors of the semiconductor device. The lower the on-resistance, the lower the power consumption of the semiconductor device.

In a general semiconductor structure, low on-resistance (Ron) and high breakdown voltage (BVD) are required. Many improvements have been disclosed by modifying the semiconductor structure, however, they usually need extra masks and more steps of process, such that the cost of manufacturing the semiconductor structure becomes higher.

SUMMARY

The disclosure is directed to a semiconductor structure, which decreases the on-resistance of the semiconductor structure. The disclosure is particularly directed to a semiconductor structure having a first isolation and a second isolation, wherein a ratio of a depth of the first isolation to a depth of the second isolation is smaller than 1, simultaneously resulting in decrease of the on-resistance and increase of the breakdown voltage, thereby reducing the cost and enhancing the characteristic of the device applied with the semiconductor structure.

According to one embodiment, a semiconductor structure is provided. The semiconductor structure comprises a substrate having a first conductive type, a deep well having a second conductive type, at least one first well having the first conductive type, at least one second well having the second conductive type, at least one gate electrode, at least one first isolation and at least one second isolation. The deep well is formed in the substrate and extending down from a surface of the substrate. The first well extends down from the surface of the substrate and is formed in the deep well. The second well extends down from the surface of the substrate and is formed in the deep well. The second well is spaced apart from the first well. The gate electrode is formed on the substrate and disposed between the first well and the second well. The first isolation extends down from the surface of the substrate and is disposed between the gate electrode and the second well. The second isolation extends down from the surface of the substrate and adjacent to the first well. A ratio of a depth of the first isolation to a depth of the second isolation is smaller than 1.

The above and other aspects of the disclosure will become better understood with regard to the following detailed description of the non-limiting embodiment(s). The following description is made with reference to the accompanying drawings.

Figure 1:
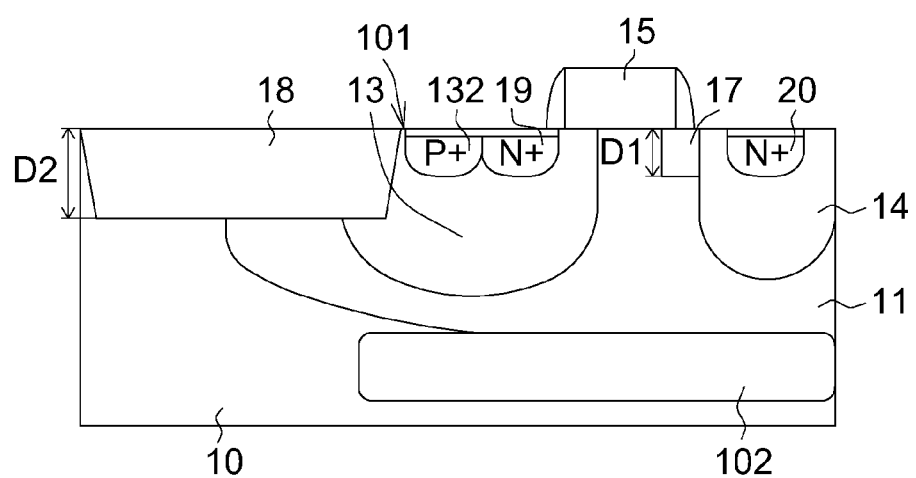
FIG. 1 illustrates a partial drawing of a semiconductor structure according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

FIG. 1 illustrates a partial drawing of a semiconductor structure 1 according to an embodiment of the disclosure. In this embodiment, the semiconductor structure 1 is, for example, a laterally diffused metal oxide semiconductor (LDMOS) structure. The semiconductor structure 1 of the embodiment includes a substrate 10 having a first conductive type (such as P-type), a deep well 11 having a second conductive type (such as N-type) formed in the substrate 10 and extending down from a surface 101 of the substrate 10, a first well 13 having the first conductive type (such as P-type) and formed in the deep well 11 by extending down from the surface 101 of the substrate 10, a second well 14 having the second conductive type (such as N-type) spaced apart from the first well 13 and formed in the deep well 11 by extending down from the surface 101 of the substrate 10, a gate electrode 15 formed on the substrate 10 and disposed between the first well 13 and the second well 14, a first isolation 17 extending down from the surface 101 of the substrate 10 and substantially disposed between the gate electrode 15 and the second well 14, and a second isolation 18 extending down from the surface 101 of the substrate 10 and substantially disposed adjacent to the first well 13. A ratio of a depth D1 of the first isolation 17 to a depth D2 of the second isolation 18 is smaller than 1.

In one embodiment, a part of the first isolation 17 can be formed in the second well 14, and a part of the second isolation 18 can be formed in the first well 13.

In this embodiment, the semiconductor structure 1 further includes a first doping electrode region 19 having the second conductive type (such as N-type) formed within the first well 13 and extending down from the surface 101 of the substrate 10, and a second doping electrode region 20 having the second conductive type formed within the second well 14 and extending down from the surface 101 of the substrate 10. The first isolation 17 can be disposed between the gate electrode 15 and the second doping electrode region 20. The first doping electrode region 19 and the second doping electrode region 20 function as a source and a drain of the semiconductor structure 1, respectively. Also, a doping region 132 having the first conductive type (such as P-type) is formed in the first well 13 and adjacent to the first doping electrode region 19 as a bulk.

The semiconductor structure 1 of the embodiment further includes a heavily-doped buried layer (BL) 102 having the second conductive type (such as N-type) and formed in the substrate 10 and under the deep well 11. In one embodiment, the semiconductor structure 1 of the embodiment varies the doping concentrations of wells near the second doping electrode region 20, the second well 14 and the deep well 11 being implanted in an order from high to low doping concentrations, respectively.

In one embodiment, the depth D1 of the first isolation 17 might be between 50 nm and 300 nm, while the depth D2 of the second isolation 18 might be between 350 nm and 450 nm. The disclosure does not be limited thereto. Instead, the depth D1 of the first isolation 17 and the depth D2 of the second isolation 18 could be adjusted according to the size of the semiconductor structure 1 in practical applications.

Moreover, at least one of the first isolation 17 and the second isolation 18 of the embodiment could be a single layer or a combination of multi-layers including several insulating layers, such as an oxide or shallow trench isolation (STI). The combination of multi-layers of at least one of the first isolation 17 and the second isolation 18 could be selected from $SiO_2$, SiON, $Si_3N_4$, SiCN, and materials with high dielectric constant. For example, at least one of the first isolation 17 and the second isolation 18 is a combination of the $SiO_2$ layer and the $Si_3N_4$ layer. Examples of materials with high dielectric constant include rare-earth (RE) oxides and lanthanide series metal oxides.

Figure 2:
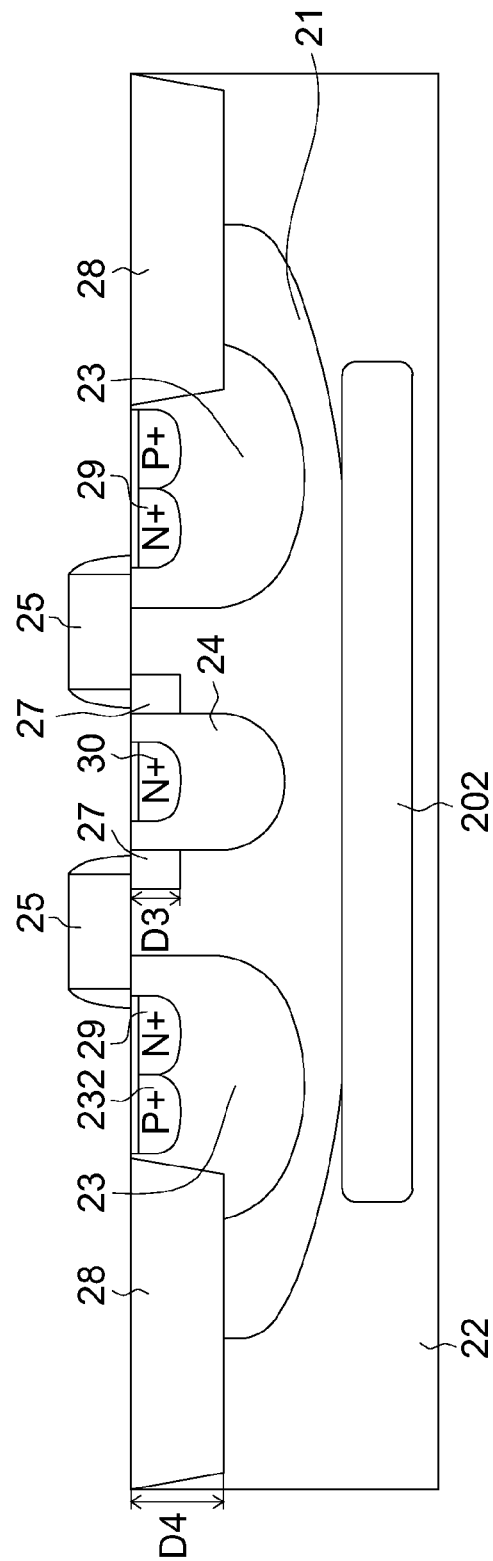
FIG. 2 illustrates a partial drawing of a semiconductor structure according to another embodiment of the disclosure.

FIG. 2 illustrates a partial drawing of a semiconductor structure 2 according to another embodiment of the disclosure. The semiconductor structure 2 is a dual structure, for example, a parallel-LDMOS structure.

The semiconductor structure 2 includes a substrate 22 having a first conductive type (such as P-type), a deep well 21 having a second conductive type (such as N-type), a heavily-doped buried layer 202 having the second conductive type and formed in the substrate 22 and under the deep well 21, a first well 23 having the first conductive type, a second well 24 having the second conductive type and formed in the deep well 21 and apart from the first well 23, a gate electrode 25 formed on the substrate 22 and substantially between the first well 23 and the second well 24, an first isolation 27 disposed substantially between the gate electrode 25 and the second well 24, and a second isolation 28 substantially disposed adjacent to the first well 23. A ratio of a depth D3 of the first isolation 27 to a depth D4 of the second isolation 28 is smaller than 1. That is, the depth D3 of the first isolation 27 is smaller than the depth D4 of the second isolation 28.

The semiconductor structure 2 further includes a first doping electrode region 29 and a second doping electrode region 30 respectively formed in the first well 23 and the second well 24, for being a source and a drain of the semiconductor structure 2. The gate electrode 25 and the second doping electrode region 30 are separated by the first isolation 27. Also, a doping region 232 having the first conductive type (such as P-type in this embodiment) is formed in the first well 23 and adjacent to the first doping electrode region 29 as a bulk.

Since the semiconductor structure 2 is a dual structure (parallel-type), the left-side and right-side structures of the second doping electrode region 30 are constructed as a mirror image. That is, the semiconductor structure 2 includes two first wells 23 disposed symmetrically from each other, two first doping electrode regions 29 disposed symmetrically from each other, two first isolations 27 disposed symmetrically from each other, two second isolations 28 disposed symmetrically from each other, and two gate electrodes 25 disposed symmetrically from each other.

Similarly to the embodiment illustrated in FIG. 1, the depth D3 of the first isolation 27 might be between 50 nm and 300 nm, while the depth D4 of the second isolation 28 might be between 350 nm and 450 nm. The disclosure does not be limited thereto. Instead, the depth D3 of the first isolation 27 and the depth D4 of the second isolation 28 could be adjusted according to the size of the semiconductor structure 2 in practical applications.

Take the semiconductor structure 1 illustrated in FIG. 1 as an example, the following states a method for manufacturing the semiconductor structure 1. The method for manufacturing the semiconductor structure 1 includes the following steps.

A substrate 10 having a first conductive type (such as P-type) is provided.

A deep well 11 having a second conductive type (such as N-type) is formed in the substrate 10 and extending down from a surface 101 of the substrate 10.

A first well 13 having the first conductive type is formed in the deep well 11 and extends down from the surface 101 of the substrate 10.

A second well 14 having the second conductive type is formed in the deep well 11 and extends down from the surface 101 of the substrate 10. The second well 14 is spaced apart from the first well 13.

A first isolation 17 extends down from the surface 101 of the substrate 10, such that the first isolation 17 has a depth D1. In one embodiment, one portion of the first isolation 17 is formed in the second well 14.

A second isolation 18 extends down from the surface 101 of the substrate 10 and is adjacent to the first well 13, such that the second isolation 18 has a depth D2. In the embodiments according to the disclosure, a ratio of a depth D1 of the first isolation 17 to a depth D2 of the second isolation 18 is smaller than 1

A gate electrode 15 is formed on the substrate 10 and between the first well 13 and the second well 14. In one embodiment, another portion of the first isolation 17 can be formed under the gate electrode 15.

In some embodiments, the steps of forming the first isolation 17 and the second isolation 18 could include steps of a first etching, a second etching and a deposition. That is, the first isolation 17 and the second isolation 18 could be formed at the same time, such that the ratio of the depth D1 of the first isolation 17 to the depth D2 of the second isolation 18 could be smaller than 1 by adjustment of the steps of the first etching and the second etching.

In other embodiments, the steps of forming the first isolation 17 and the second isolation 18 could include steps of a first etching, a first deposition, a second etching and a second deposition. The depth D1 of the first isolation 17 could be determined in one of the first etching step and the second etching step, while the depth D2 of the first isolation 18 could be determined in another one of the first etching step and the second etching step, such that the depth D1 of the first isolation 17 could be smaller than the depth D2 of the second isolation 18. That is, the second isolation 18 could be formed before or after the first isolation 17.

In one embodiment, the method for manufacturing the semiconductor structure 1 further includes the following steps.

A first doping electrode region 19 having the second conductive type is formed within the first well 13 and extends down from the surface 101 of the substrate 10.

A second doping electrode region 20 having the second conductive type is formed within the second well 14 and extends down from the surface 101 of the substrate 10, such that the first isolation 17 could be disposed between the gate electrode 15 and the second doping electrode region 20.

The description of the method for manufacturing the semiconductor structure 2 will be omitted since it is similar to the method for manufacturing the semiconductor structure 1.

Figure 3:
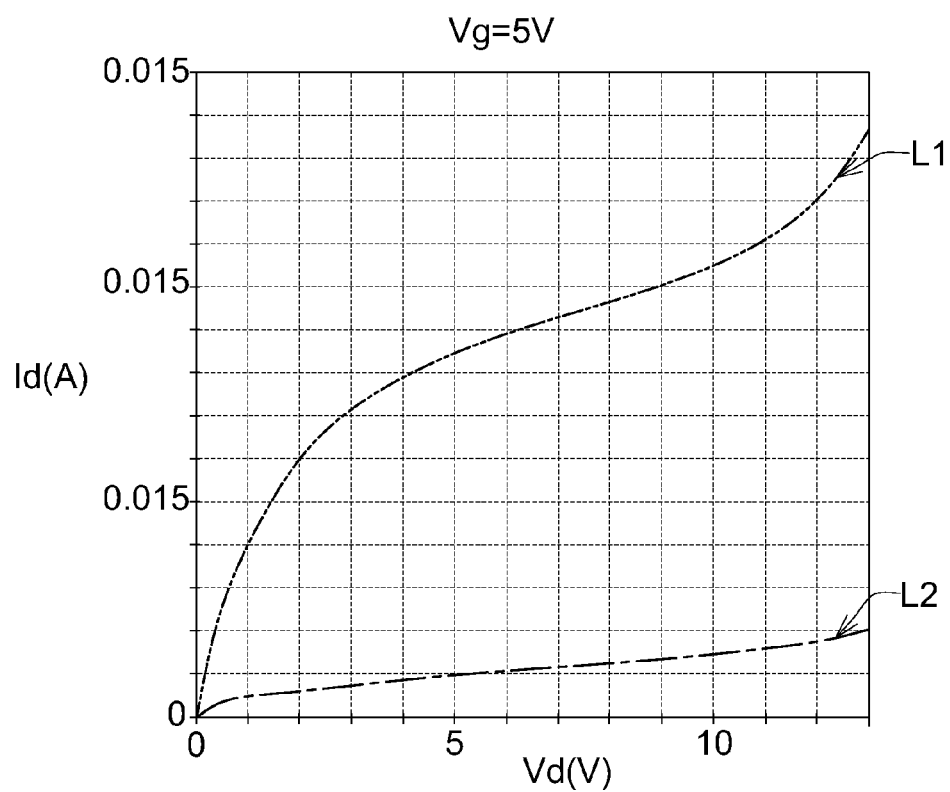
FIG. 3 illustrates an I-V curve of a semiconductor structure according to an embodiment of the disclosure and a comparative example when the gate voltage is 5V.

FIG. 3 illustrates an I-V (current of the drain Id verses voltage of the drain Vd) curve of a semiconductor structure according to an embodiment of the disclosure and a comparative example when the gate voltage Vg is 5V. The difference between the semiconductor structure according to an embodiment of the disclosure and the comparative example is the depth of the isolation. In the embodiment of the disclosure, the depth of the first isolation disposed between the gate electrode and the second doping electrode region (drain) is smaller than the depth of the second isolation. In the comparative example, the depth of the isolation disposed between the gate electrode and the second doping electrode region (drain) is the same as other isolations.

In TABLE 1 and FIG. 3, the depth of the first isolation in the embodiment according to the disclosure is 100 nm, while the depth of the second isolation in the embodiment according to the disclosure is 400 nm. All isolations in the comparative example are 400 nm. In FIG. 3, the embodiment according to the disclosure corresponds to line L1, and the comparative example corresponds to line L2.

TABLE 1

|  | Dsti (nm) | Idl (μA/μm) | Ron (mΩ*mm²) | BVD (V) | Ron/BVD |
|---|---|---|---|---|---|
| embodiment according to the disclosure | 100 | 25.3 | 7.5 | 32 | 0.23 |
| comparative example | 400 | 4.1 | 46.5 | 30 | 1.55 |

Dsti: the depth of the isolation disposed between the gate electrode and the second doping electrode region (drain)
Id: current of drain per unit length
Ron: on-resistance
BVD: breakdown voltage As shown in FIG. 3, in the conditions of different Vd values, values of Id in the embodiment according to the disclosure (line L1) are larger than values of Id in the comparative example (line L2). It could be explicitly shown in TABLE 1 that the value of Ron in the embodiment according to the disclosure is smaller than the value of Ron in the comparative example. Further, the ratio of the on-resistance to the breakdown voltage (Ron/BVD) in the embodiment according to the disclosure is smaller than the ratio of the on-resistance to the breakdown voltage (Ron/BVD) in the comparative example.

Accordingly, since the ratio of the depth of the first isolation to the depth of the second isolation is smaller than 1 in the semiconductor structure of the embodiments, not only decreasing the on-resistance and the power consumption, but also increasing the breakdown voltage of the semiconductor structure. There is an efficiently decrease of the ratio of Ron/BVD. For PMIC (power management integrated circuit) application, especially for the portable IC devices, the characteristic and performance of the products applied with the structure of the embodiment have been greatly improved. Moreover, the semiconductor structure according to the embodiment does not need extra masks and more steps of the process. Therefore, the devices applied with the semiconductor structure of the embodiment possess high competitiveness in the commercial market.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a substrate having a first conductive type;
   a deep well having a second conductive type, formed in the substrate and extending down from a surface of the substrate;
   at least one first well having the first conductive type, extending down from the surface of the substrate and formed in the deep well;
   at least one second well having the second conductive type, extending down from the surface of the substrate and formed in the deep well, and the second well spaced apart from the first well;
   at least one gate electrode, formed on the substrate and disposed between the first well and the second well;
   at least one first isolation, extending down from the surface of the substrate and disposed between the gate electrode and the second well; and
   at least one second isolation, extending down from the surface of the substrate and adjacent to the first well;
   wherein a ratio of a depth of the first isolation to a depth of the second isolation is smaller than 1.

2. The semiconductor structure according to claim 1, wherein the depth of the first isolation is between 50 nm and 300 nm.

3. The semiconductor structure according to claim 1, wherein the depth of the second isolation is between 350 nm and 450 nm.

4. The semiconductor structure according to claim 1, wherein the first conductive type is P-type, and the second conductive type is N-type.

5. The semiconductor structure according to claim 1, wherein a portion of the first isolation is formed in the second well.

6. The semiconductor structure according to claim 1, wherein a portion of the second isolation is formed in the first well.

7. The semiconductor structure according to claim 1, further comprising:
   at least one first doping electrode region having the second conductive type, extending down from the surface of the substrate and formed within the first well.

8. The semiconductor structure according to claim 7, further comprising:
   at least one second doping electrode region having the second conductive type, extending down from the surface of the substrate and formed within the second well, wherein the first isolation is disposed between the gate electrode and the second doping electrode region.

9. The semiconductor structure according to claim 8, wherein the semiconductor structure is a dual structure, and the left-side and the right-side structures of the second doping electrode region are constructed as a mirror image.

10. The semiconductor structure according to claim 9, comprising two of the symmetrical first wells, two of the symmetrical first doping electrode regions, two of the symmetrical first isolations, two of the symmetrical second isolations and two of the symmetrical gate electrodes.

11. The semiconductor structure according to claim 1, wherein at least one of the first isolation and the second isolation is a single layer or a combination of multi-layers.

12. The semiconductor structure according to claim 11, wherein at least one of the first isolation and the second isolation is a shallow trench isolation (STI) or an oxide.

13. The semiconductor structure according to claim 11, wherein the combination of multi-layers is selected from $SiO_2$, SiON, $Si_3N_4$, SiCN, and materials with high dielectric constant.

14. The semiconductor structure according to claim 1, further comprising:
   a heavily-doped buried layer having the second conductive type and formed in the substrate and under the deep well.

15. The semiconductor structure according to claim 1, wherein the semiconductor structure is a laterally diffused metal oxide semiconductor (LDMOS) structure.

* * * * *